（12）United States Patent
Maijala et al.

(10) Patent No.: US 10,658,209 B2
(45) Date of Patent: May 19, 2020

(54) APPARATUS AND METHOD FOR COMPONENT POSITINING

(71) Applicant: Stora Enso OYJ, Helsinki (FI)

(72) Inventors: Juha Maijala, Espoo (FI); Petri Sirvio, Imatra (FI); Tommi Jokinen, Salo (FI)

(73) Assignee: Stora Enso, OYJ, Helsinki (FI)

( * ) Notice: Subject to any disclaimer, the term of this patent is extended or adjusted under 35 U.S.C. 154(b) by 191 days.

(21) Appl. No.: 15/548,801

(22) PCT Filed: Feb. 2, 2016

(86) PCT No.: PCT/IB2016/050516
§ 371 (c)(1),
(2) Date: Aug. 4, 2017

(87) PCT Pub. No.: WO2016/125075
PCT Pub. Date: Aug. 11, 2016

(65) Prior Publication Data
US 2018/0033658 A1    Feb. 1, 2018

(30) Foreign Application Priority Data
Feb. 6, 2015   (SE) ...................... 1550134

(51) Int. Cl.
H05K 3/30         (2006.01)
H01L 21/67        (2006.01)
(Continued)

(52) U.S. Cl.
CPC .. H01L 21/67144 (2013.01); H01L 21/67265 (2013.01); H01L 21/68 (2013.01);
(Continued)

(58) Field of Classification Search
CPC ......... H01L 21/67144; H01L 21/67265; H01L 21/68; H05K 13/021; H05K 13/028;
(Continued)

(56) References Cited

U.S. PATENT DOCUMENTS 3,499,203 A    3/1970   Clark et al.
5,853,078 A    12/1998  Kneubuhler
(Continued)

FOREIGN PATENT DOCUMENTS

EP    0772229 A2    5/1997
EP    091457        5/1999
(Continued)

OTHER PUBLICATIONS

International Search Report for PCT/IB2016/050516, dated May 12, 2016.

*Primary Examiner* — Paul D Kim
(74) *Attorney, Agent, or Firm* — Greer, Burns & Crain, Ltd.

(57) ABSTRACT

Apparatus (200, 300, 400) for component positioning comprises at least one receptacle (212, 412) configured to receive a number of components (103) to be placed on a target substrate (108, 111), agitator (210, 410) configured to exert force impulses, such as abrupt force impulses, on the receptacle so as to cause the components to change their position inside the receptacle, inspection equipment (216, 316, 416) configured to verify the position of the components inside the receptacle, and pick and place equipment (206, 306, 406) configured to pick one or more components from the receptacle that fulfil a predefined position criterion and place the components on the target substrate. A related method for component positioning is presented.

20 Claims, 4 Drawing Sheets

(51) Int. Cl.
    *H05K 13/04*     (2006.01)
    *H05K 13/02*     (2006.01)
    *H05K 13/08*     (2006.01)
    *H01L 21/68*     (2006.01)
    *H05K 3/12*     (2006.01)

(52) U.S. Cl.
    CPC ............ *H05K 3/12* (2013.01); *H05K 13/021* (2013.01); *H05K 13/028* (2013.01); *H05K 13/043* (2013.01); *H05K 13/046* (2013.01); *H05K 13/081* (2018.08)

(58) Field of Classification Search
    CPC .. H05K 13/043; H05K 13/046; H05K 13/081; H05K 3/12
    See application file for complete search history.

(56) References Cited

U.S. PATENT DOCUMENTS

| | | | |
|---|---|---|---|
| 2005/0238540 A1* | 10/2005 | Swon | ................. B01F 11/0082 422/561 |
| 2011/0204147 A1 | 8/2011 | Amadeo et al. | |
| 2014/0030849 A1 | 1/2014 | Hwang et al. | |

FOREIGN PATENT DOCUMENTS

| | | | |
|---|---|---|---|
| WO | 2005008726 | A2 | 1/2005 |
| WO | 2008136778 | A1 | 11/2008 |
| WO | 2012073284 | A1 | 6/2012 |

\* cited by examiner

APPARATUS AND METHOD FOR COMPONENT POSITINING

This application is a U.S. National Stage under 35 U.S.C. § 371 of International Application No. PCT/IB2016/050516, filed Feb. 2, 2016, which claims priority to Swedish patent application no. 1550134-9, filed Feb. 6, 2015.

FIELD OF THE INVENTION

Generally the present invention relates to manufacturing of products incorporating components. Especially, however not exclusively, the present invention pertains to manipulation of electronic components from transport or storage position to a target position on a destination substrate.

BACKGROUND

During manufacturing of electronic products, a component such as an integrated circuit (IC), or 'chip', of semiconductor or other suitable material may be conveyed towards a destination substrate such as a conventional circuit board, or a flexible circuit board, e.g. a plastic film, paper or cardboard substrate, using a variety of methods. Depending on the scenario, such procedures typically comprise picking a chip from a source location, optionally changing the orientation of the chip and ultimately placing the picked chip at a target location on the substrate. Picking may be suction-assisted, for instance.

In FIG. 1, with reference to arrangement 100 one exemplary scenario is shown for further clarification. Flip chip packaging is nowadays often preferred over more traditional SMDs (surface mount device) requiring e.g. wire bonding due to evident cost, size, electrical performance, I/O connection flexibility and durability advantages. So, a plurality of e.g. solder bumped flip chips 103 may have been originally manufactured as portions of a common silicon wafer. The larger wafer defining the plurality of chips may have been then sawn or cut into individual chips during 'dicing'. Alternatively, dicing could take place during or at the beginning of a pick-and-place procedure reviewed more thoroughly below.

Reverting to the details of the figure, at 100A, a robotic manipulator arm 104 or other actuator is used to pick up each flip-chip 103 (notice the bumps 105 depicted on the top surface of the chips), one at a time, from the diced wafer located on a source substrate, such as a carrier membrane, or a container, such as a tray, 102. The arm 104 comprises a head for the purpose, optionally exploiting vacuum suction to hold the chip 103.

At 100B, the manipulator arm 104 rotates the picked up chip 103 upside down, the bumps 105 thereby facing downwards, and hands over the rotated chip 104 to a bonding or mounting arm 106 that, at 100C, aligns and disposes the chip to a target location on the destination substrate 111. The arm 106 may execute a so-called place-and-press function, which besides placing the chip at the right location on the substrate 111, also presses it against it so that both mechanical and electrical attachment is secured. The substrate may have been provided beforehand with a circuit layout including e.g. printed conductors and contact areas 108 for accommodating a number of chips. Further, flux may have been spread on the solder bumps 105 or contact areas 108 during the process, and/or provided in the material of the solder bumps 105 itself.

Publication WO2012049352 discloses a method and apparatus for chip picking and placement in accordance with the afore-explained procedure of FIG. 1. The surface area 108 of the substrate 111 on which the chips 103 are attached has been initially provided with material that has lower melting temperature than the chips 103 can tolerate without being damaged, with reference to low-temperature solder or similar material, whereupon each chip 103 can be safely heated to an elevated temperature that still induces no damage to the chip, but causes the material of the area 108 and/or solder bumps 105 of the chip 103 to melt and secure the bonding while the chip 103 is pressed against the surface 108 of the substrate 111.

The procedure disclosed in the aforementioned publication '352 is obviously highly advantageous as it generally accelerates the bonding procedure and the use of e.g. conventional surface mount reflow ovens can be omitted.

Notwithstanding the evident benefits the modern manufacturing and mounting techniques of components, such as the discussed flip chip solutions, offer to the state of the art, continued optimization of component assembly processes is still generally desired in terms of manufacturing costs, complexity, production times, and yield, i.e. multiple inter-related factors. Whether the optimization is worth the trouble depends, of course, on the scale of the manufacturing activity. As the related business grows, also the technical black spots arising from sub-optimum processes rise in importance and eventually form different types of actual bottlenecks in the production chain.

Accordingly, depending on the use scenario, certain operations regarding the handling of flip chips or other electronic or non-electronic components may be more problematic or simply more undesired than the rest, even if providing completely satisfactory results in terms of production accuracy or product reliability. With robotic manipulators such as aims for picking, treating and/or placing components, rotational movement particularly if to be combined with or succeeded or preceded by translational movement in three dimensions may be both technically challenging and costly to implement in a high speed production line with sufficient long-term reliability and accuracy. It may thus establish one bottleneck of the system.

For example, the arms 104 and 106 of the arrangement 100 may have been configured for both rotational and translational (sideways or vertical) movement to be able to comprehensively execute the required chip picking, chip flipping, and chip mounting procedures as contemplated hereinbefore. Such versatile aims 104, 106 are generally feasible, and in many contexts cause no real headache, but occasionally together with increase in the production output, the diverse 3d trajectories potentially involving both rotation and translational movement may at certain point begin to limit the process speed and make it unnecessarily complex, costly, inaccurate and even unreliable.

SUMMARY OF THE INVENTION

The objective is to provide an alternative solution for assembling components such as chips on a target substrate, which at least alleviates one or more of the aforesaid challenges of the existing solutions.

The objective may be met with embodiments of an apparatus and related method in accordance with the present invention.

Accordingly, in one aspect an apparatus for component positioning comprises
a receptacle, such as a tray, configured to receive a number of components to be placed on a target substrate, agitator configured to exert force impulses, such as abrupt force impulses, on the receptacle so as to cause the components to change their position including turning over inside the receptacle, inspection equipment, optionally comprising a computer vision system, configured to verify the position of the components inside the receptacle to identify one or more components that fulfil a predefined position criterion from the remaining components to be agitated more, and pick and place equipment configured to pick said identified one or more components from the receptacle that fulfil the predefined position criterion and place the components on the target substrate while leaving the remaining components in the receptacle for further agitation.

In various embodiments, the apparatus may comprise feeding equipment configured to position components in said at least one receptacle from a source carrier.

In various embodiments, the apparatus may comprise a heater to heat the chip or other component prior to or upon placing it on the substrate. Heating may cause the solder on the component and/or on the target substrate to melt, for instance, and improve bonding. The heater may be integrated with the pick and place equipment, e.g. in connection with the pick-up heads, or be separate therefrom.

In various embodiments, the apparatus may comprise a flux dispenser configured to provide flux on the chip (bumps) or other component, optionally between pick and place procedures, and/or substrate to improve bonding.

In another aspect, a method for component positioning comprises locating a number of components to be finally placed on a target substrate, in a component receptacle, optionally a tray, intermittently exerting force on the receptacle so as to cause the components to change their position including turning over within the receptacle, verifying the position of the components within the receptacle, identifying one or more components that fulfil a predefined position criterion from the remaining components to be agitated more, and picking one or more components from the receptacle that fulfil the predefined position criterion according to the verification, and placing the components on the target substrate while leaving the remaining components in the receptacle for further agitation.

Further features of various embodiments of the present invention become clear to a skilled reader based on the following detailed description.

Yet, different considerations presented herein regarding the embodiments of the apparatus may be flexibly applied to the embodiments of the method mutatis mutandis and vice versa, as being appreciated by a skilled person.

The utility of the present invention arises from a plurality of issues depending on each particular embodiment. First of all, e.g. flip chipping type component assembly from a wafer is cultivated in terms of process throughput/speed, reliability, simplicity and associated cost effectiveness. The use of complex flip chipping capable arrangements potentially incorporating e.g. SCARA (selective-compliance-articulated robot aims) or e.g. six-axis robotic aims for operating and rotating the actual picking/placing gear may be omitted or at least reduced, and more rapid, robust and simple options, e.g. Cartesian (linear in XYZ direction) solutions, utilized instead.

The suggested solution is generally scalable as the number of receptacles, agitator members, and e.g. pick-and-place equipment may be conveniently adjusted. Multiple pick up elements such as nozzle-provided heads embodied in one or more robotic actuators/arms may be exploited to enable quick, substantially simultaneous handling and bonding of several components of mutually similar or different type.

In addition to chips, or in particular flip chips, the present invention may find use in a great variety of other applications wherein generally electronic or non-electronic components are to be flipped or otherwise re-oriented prior to final placement. Anyway, the components shall be selected such that they tolerate some agitation and related forces subjected thereto during the procedure. Lighter or smaller components may be preferred over heavier or bulkier ones as with heavy components their own weight may more easily cause damages upon agitation, such as edge fractures in the case of a chip. The associated risk may be reduced through the use of elastic material at the agitator surface contacting the component. The component may also itself contain elastic surface material.

The expression "a number of" may herein refer to any positive integer starting from one (1).

The expression "a plurality of" may refer to any positive integer starting from two (2), respectively.

The terms "a" and "an" do not denote a limitation of quantity, but denote the presence of at least one of the referenced item.

The terms "first" and "second" do not denote any order, quantity, or importance, but rather are used to distinguish one element from another.

BRIEF DESCRIPTION OF THE DRAWINGS

Next the present invention will be described in greater detail with reference to the accompanying drawings, in which.

DETAILED DESCRIPTION

As being clear to a person skilled in the art, a pick and place procedure in the context of components such as chips, generally relates to positioning the components on a target substrate. The associated equipment is configured to select and pick up a correct component from a carrier container, support or feeder, and place it on the target substrate with the required accuracy and speed.

The present invention and its embodiments principally apply for this same purpose but with improved features in terms of industrial applicability particularly in use scenarios where the original position of the components prior to the mounting is sub-optimal or perhaps completely unsuitable for straightforward pick, move and drop type implementation, which is often the case e.g. with flip chips or similar components that may have to be flipped or otherwise re-aligned potentially completely during the pick and place or before.

Figure 1:
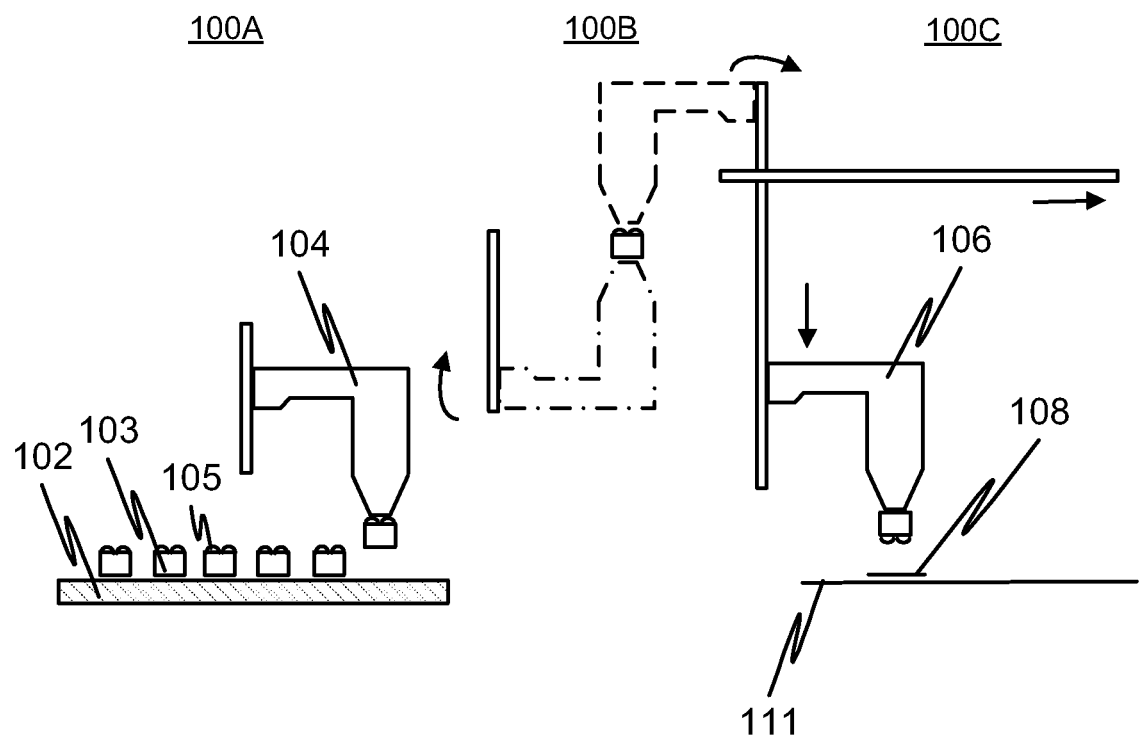
FIG. 1 depicts one example of a prior art procedure for mounting flip chips on a target substrate.

FIG. 1 was already contemplated hereinbefore in connection with the description of background art.

Figure 2:
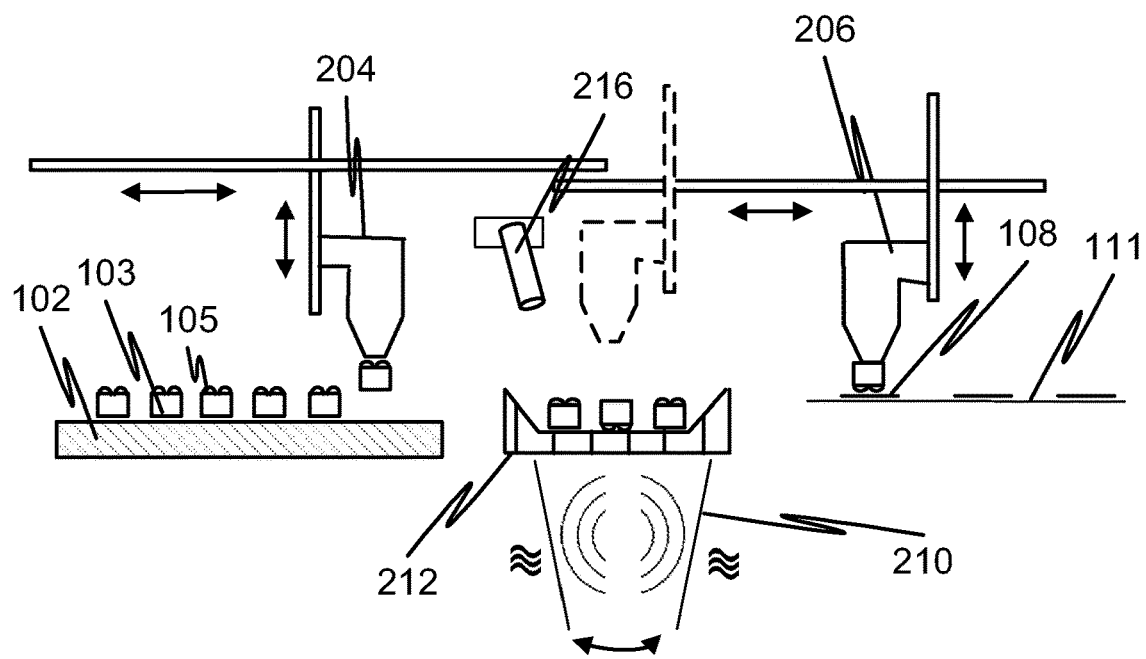
FIG. 2 illustrates one embodiment of a present invention.

FIG. 2 illustrates, at 200, one embodiment of a present invention.

At 200A, a plurality of flip chips 103 have been provided on a source substrate 102, such as a carrier or a dicing membrane, as ready diced. Alternatively, the apparatus of the present invention could also contain equipment for dicing and optionally further pre-processing the input components.

The apparatus preferably comprises or is at least operatively connected to feeding equipment 204 incorporating e.g. a robot or manipulator arm, or other type of actuator, for picking one or preferably multiple chips at a time. The feeding equipment 204 shall be generally selected based on the requirements set by each use scenario depending on e.g. the type of the component packaging. Rather commonly, especially electronic components are delivered from the manufacturer using tape, sticks or trays, such as waffle trays, or on the aforementioned dicing substrate/membrane.

A number of chips is thus picked from the source carrier at a time and disposed at one or more receptacles 212, optionally trays. Each receptacle 212 may be configured to accommodate one or more components. For example, a tray with a substantially flat central platform and raised edges may be utilized as a receptacle 212.

The receptacle 212 may have e.g. circular or angular, optionally rectangular, cross-section. Optionally, the receptacle 212 may contain side walls or supports. In some embodiments, the receptacle 212 could even contain optionally automatically operable lid.

The surface within the receptacle 212 for receiving and contacting the chips 103 may be provided with functional material. For example, anti-static, elastic (to prevent chip damage arising from the contact), and/or friction surface may be provided. Rubber or rubbery material may be considered for the purpose. Polymer film or metal foil may also be contemplated. Accordingly, the chips 103 shall generally properly stay in place except due to intentional agitation at 200B by the agitator 210 connected to the receptacle 212.

The agitator 210 may comprise, for instance, at least one element selected from the group consisting of: vibration element, vibrating motor, ac motor, dc motor, unbalanced motor, piezoelectric element, hydraulic element, servo motor, and pneumatic element. The element(s) may be configured to physically contact the receptacle 212 either directly or via a number of intermediate elements or material layers.

Agitation by the agitator 210 directs force impulses to the chip(s) 103 via the receptacle(s) 212 that may then vibrate, shake, tilt, rotate, be subject to air or gas flow, etc. The chip(s) 103 will be affected accordingly and their position may change. In some embodiments, agitation may be selective so that only a portion of the chips 103 within the receptacle 212 is to be re-positioned. For example, a particular impulse location within the receptacle 212 may be selected so as to affect chip(s) 103 thereat more than at remaining locations.

In the case of flip chips, agitation preferably causes at least part of the chips 103 with bumps 105 initially facing upward, i.e. away from the receptacle surface, to turn over so that the solder bumps 105 face downward, i.e. towards the receptacle surface, and the chips 103 are ready for placement on the target substrate 111 without further flipping.

Yet, a variety of errors in the positioning of the chip 103 on the substrate 111 may be thus advantageously minimized in addition to flipping, including e.g. rotational error and translational error. Agitation may change the orientation or alignment of the chip 103 relative to a reference such as agitator 210 and/or substrate 111 so that the placement 200C of the chip 103 on the substrate 111 becomes easier and simpler, for example. Rotation of the chip 103 during the placement phase may be thus omitted or at least reduced among other potential benefits.

When one or multiple chips 103, or other components, are, at a time, located in the receptacle 212, a single agitation procedure or round (e.g. one or few subsequent shaking operations or vibration of limited duration followed by a pause) may not always change the position of each chip 103 at once to optimal or even adequate one from the standpoint of placement 200C.

The apparatus advantageously further includes inspection equipment 216 such as imaging gear (one or more cameras, for example) or more functionally, computer vision system, which together with the associated executed analysis algorithm is capable of detecting component position having regard to desired parameters. Additionally or alternatively, other, optionally contactless, position sensing may be applied.

Therefore, chip(s) 103 the position of which suits the following placement operation at 200C well enough according to the used criterion, can be identified and picked up by a pick and place equipment 206. The potential remaining mispositioned chip(s) 103 may be left for the next agitation action or round. Meanwhile, new chip(s) 103 may be added to the receptacles between the subsequent agitation actions or rounds, for example. Adding new chips 103 may first require determining the available space in the receptacle(s) 210, which may further incorporate using the inspection equipment 216 and/or other equipment such as weighting equipment. Space data may be used to determine the number of new chips 103 to be added from the substrate 102.

Pick and place equipment 206 for mounting the chips 103 at the correct position on the substrate or more specifically, on electrical conductors or conductive areas 108 such as contact pads (optionally further provided with solder and/or flux) established on the substrate by means of printed electronics or otherwise, may include at least one actuator such as a robot/manipulator arm. The actuator may comprise e.g. at least one placement head, pipette, suction based nozzle or other gripping gear, motor(s) such as servo motor(s), hydraulic element(s), pneumatic element(s), and/or solenoid(s), etc. The substrate 111 may contain or define a web, sheet, film, foil, roll, a multilayer structure, etc. The actual material of the substrate may consist of or include at least one material selected from the group consisting of: plastics, ceramics, fiber, web, paper, cardboard, fabric, wood, felt, metal, organic and biological material.

In various embodiments of the present invention, actuators of the feeding 204 and/or pick-and-place 206 assemblies may involve elements for transporting one or multiple chips 103 or other components at a time. Either a single-head actuator or a multi-head actuator or other corresponding element with potentially several suction nozzles or other attachment features may be applied. Additionally or alternatively, several actuators such as arms may be exploited. The related equipment may define a Cartesian/gantry (overhead) type robot, for instance. In addition to picking up or placement action (Z-axis motion, i.e. motion typically substantially perpendicular to the substrate 111 surface), movement across a certain plane such as horizontal plane (XY-plane) may be implemented by the equipment. Optionally, further movement such as rotary motion may be supported by the equipment for providing greater position manipulation.

Preferably though, e.g. the equipment 206 used for picking and placing at 200C are kept relatively simple what comes to the utilized motion in favour of placement accuracy, speed, equipment cost and reliability. Linear movement may be preferred over rotation, for example. If necessary, it is in many embodiments more desirable to rotate e.g. the receptacle(s) 212 instead of the actuator of equipment 204 or 206.

Figure 3:
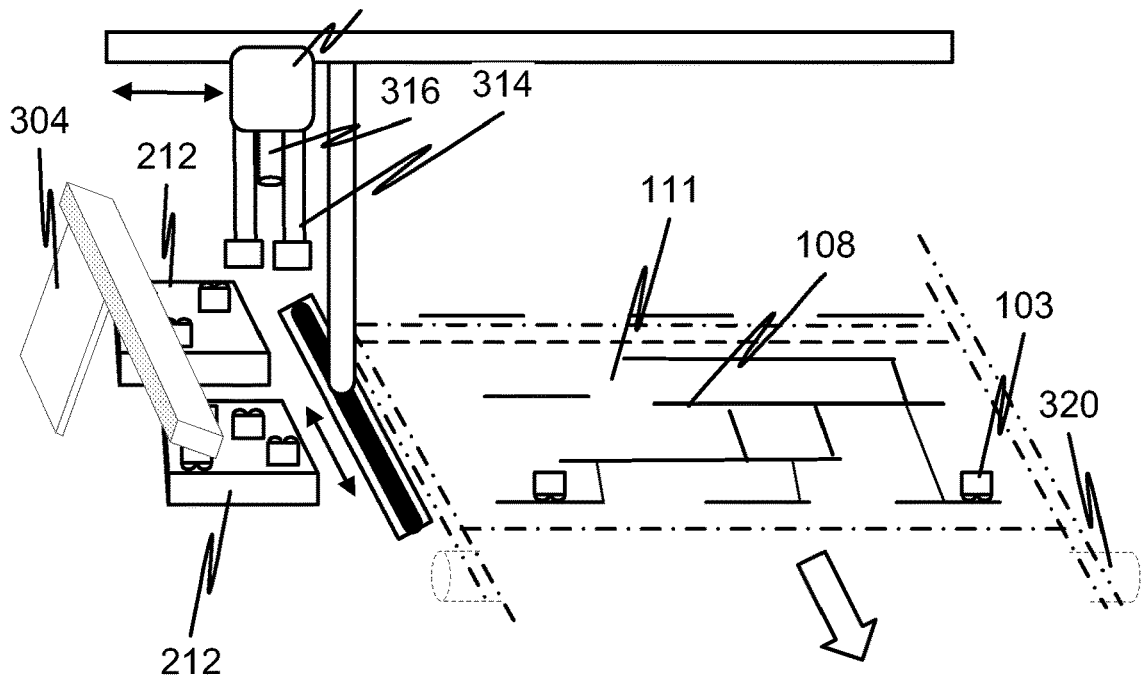
FIG. 3 illustrates a related embodiment with more specific examples of applicable technical features.

FIG. 3 illustrates, at 300, a variation of the embodiment of FIG. 2. Two receptacles 212 supplied by the feeding equipment 304 of any suitable type have been harnessed for re-positioning the fed chips 103. Agitation equipment is provided but not shown in the figure for clarity purposes. Gantry style pick and place equipment 306 comprises a multi-head actuator 314 and integrated inspection equipment 316, or at least part thereof, such as one or more cameras enabling mono or stereo imaging, respectively. Optionally, multiple actuators could be used in the equipment 306, optionally at least one dedicated actuator per each receptacle 212. In this and other embodiments, pick and place equipment may generally comprise a number of receptacle-dedicated elements such as actuators and/or common elements/actuators, both alike.

A conveyor system 320 such as a conveyor belt system may be applied to transport substrate 111 forward. Optionally the substrate 111 is flexible film, sheet or foil. It may be continuous and accommodate a plurality of optionally adjacent product instances thereon to be cut separate after the depicted phase. Optionally, the feeding equipment 304 incorporates a conveyor system of its own.

Figure 4:
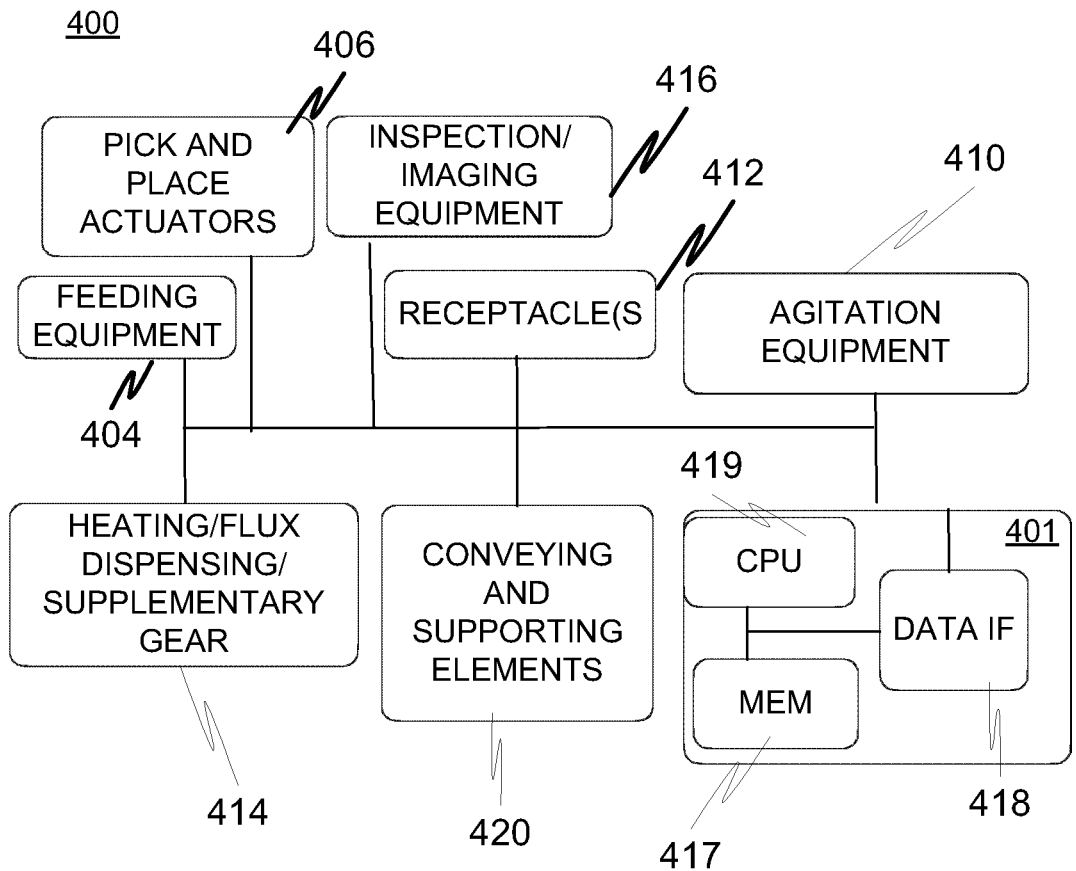
FIG. 4 is a block diagram of an embodiment of an apparatus in accordance with the present invention.

FIG. 4 depicts, at 400, a block diagram of an embodiment of an apparatus in accordance with the present invention. The diagram basically applies to the embodiments of FIGS. 2 and 3 as well as to numerous other embodiments, the present invention being however not strictly limited to apparatuses following the diagram.

The apparatus of the present invention may be a substantially integral aggregate or ensemble of features and elements altogether forming also a functional entity characterized herein. It may, for example, comprise a common housing for multiple elements and/or have all or at least most of the parts at least indirectly, if not directly, physically connected together. Anyhow, the apparatus, or 'arrangement', as meant to be understood in connection with the present invention, may alternatively comprise multiple physically separate but still functionally connecting elements, each serving a purpose of its own in providing the target substrate with properly positioned components.

Pick and place actuators 406 refer to the equipment that provides the target substrate with components from the one or more receptacles such as trays. Feeding equipment 404 provides component supply from a source container or substrate, e.g. membrane or tray.

Inspection equipment 416 refers to imaging equipment or other gear that can be used to verify the position of the component(s) within the receptacle(s) 412 prior to, during, and/or after agitation by the agitation equipment 410. Current position of the component(s) may be compared with reference position(s) such as target position(s) on the target substrate to separate the components that are ready for pick-and-place from the components that are still to be agitated more.

Heating, flux dispensing, underfill provision, lamination, molding, adhesive dispensing (substrate and/or chip), and/or other gear 414, e.g. cutting equipment, printing equipment or solder dispenser, may be used for various purposes during the suggested process. Heating equipment, for instance, may be optionally integrated with pick and place actuators 406 and used for heating the components prior to placing on the substrate such that the related solder and/or substrate/conductor material melts and the associated bond is secured. Printing equipment may be used for printing electronics, such as conductors and/or components, on the target substrate. Cutting equipment may be used for cutting the substrate in pieces following the contour of independent target products, for example.

A component or chip sorter or generally, screening equipment may be utilized to remove damaged or otherwise useless components from the source container, source substrate or e.g. receptacle so that they do not end up on the target substrate. Inspection equipment 416 may be used for decision-making according to a number of predefined criteria. Alternatively or additionally, e.g. wafer map, or 'substrate map', may be utilized to determine unfit components for removal.

Conveying and supporting elements 420 include e.g. support surfaces, trays, rolls, conveyor belts, etc. that may be used for transporting or supporting components, tools, and e.g. electronics substrate.

Item 401 refers to the control portion. In reality, such control portion may be distributed and different elements of the apparatus may contain control logic e.g. in the form of a processing unit and memory of their own instead of or in addition to centralized control. Control logic or unit 419 may include a processor, microprocessor, signal processor, microcontroller, programmable logic chip, etc. for processing instructions and other data. Memory 417 may contain volatile memory and non-volatile memory for storing instructions and other data. Data interface 418, such as a (wired) network/communication adapter or a wireless network/communication adapter, may be utilized to transfer data between the apparatus 400 and external entities such as remote control entity or a remote network and related entities, such as servers. The interface 418 may support a selected number of industrial automation communication protocols, short range wireless protocols (e.g. Bluetooth™ or WLAN (Wireless Local Area Network)), local area protocols (e.g. Ethernet), or cellular protocols (e.g. GSM (Global System for Mobile Communications), UMTS (Universal Mobile Telecommunications System), or 4G), for instance.

In terms of hardware, e.g. inspection equipment 416 may share common components with control portion 401 with reference to processing and memory elements, for instance.

Figure 5:
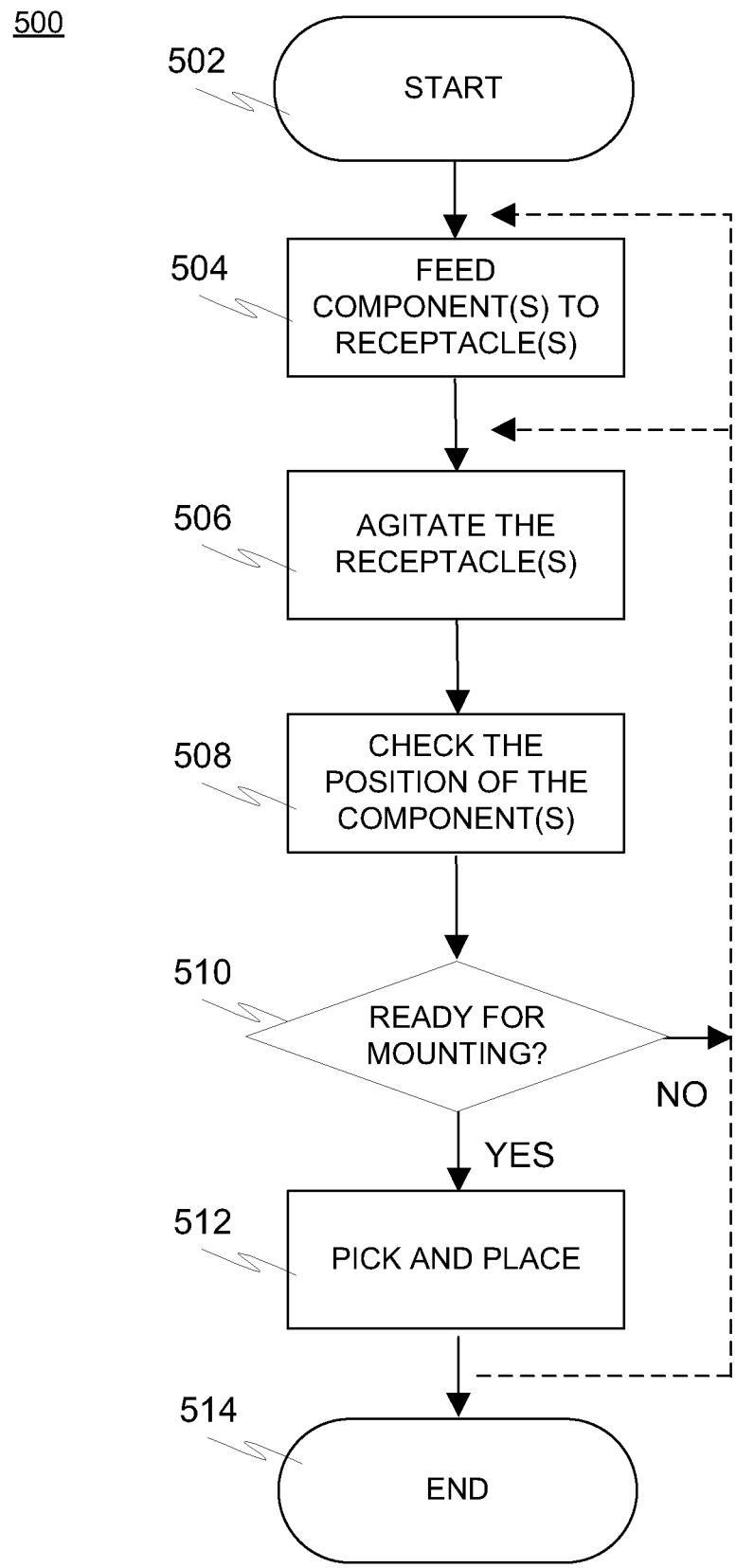
FIG. 5 is a flow diagram disclosing an embodiment of a method in accordance with the present invention.

FIG. 5 is a flow diagram disclosing an embodiment of a method in accordance with the present invention.

At start-up 502, necessary preparatory actions such as acquisition and configuration of process equipment and parameters may be executed. Components, substrates, solder, flux, adhesive, etc. may be obtained. The process parameters controlling the apparatus executing the method shall be selected such that the utilized substrate, components and other elements tolerate them. The target substrate may be provided with components or conductors/conductive areas optionally by applicable printed electronics technology, such as screen printing or ink jetting, for instance. Such activity may additionally or alternatively take place in parallel with execution of any of the following method items. Aesthetic/decorative and/or indicative features may further be provided to the substrate by printing or otherwise.

At 504, one or more components such as chips, at a time, are disposed, or distributed, at one or more receptacle(s) such as trays. The components may include surface mount components, especially flip chips. Substantially simultaneous multi-picking of several components from a wafer may be executed, for instance.

Instead of particularly delicate, pre-planned or precise positioning, the components may be dropped in a number of receptacles optionally substantially randomly. A receptacle may be configured (dimensioned, etc.) to accommodate between about 10 and 100 components at a time, for instance. The surface of the receptacle may include e.g. anti-static property to reduce the risk of electric discharges by the components agitating thereon. Depending on the feeding equipment and overall process features or parameters, one feeding round or feeding action may feed only a single component or e.g. tens of components to at least one receptacle.

At 506, at least one receptacle is agitated such as shaken so that the position of at least some accommodated components will change. They may, for instance, flip over and/or otherwise re-align relative to the target substrate. The force exerted on the component(s) through agitation is preferably intermittent, feeding, inspection and/or pick up periods occurring in between. A related agitation action or round may refer to a single impulse or a sequence of multiple impulses.

At 508, the results of the agitation are investigated optionally optically using at least one camera and other applicable computer vision, i.e. image analysis and pattern recognition, logic and gear. The imaging equipment may operate at visible and/or other wavelengths. Components suitable for subsequent pick and place taking place next may be determined from all components residing within the receptacle(s) at 510 according to a number of predetermined position criteria.

In the case of several receptacle(s), they may be used in parallel so that when a first receptacle is subjected to first operation such as feeding, investigation or pick up procedure, a second receptacle may be simultaneously subjected to second operation, such as agitation. If there also is dedicated pick and place equipment, e.g. arms/head, allocated for each receptacle, the associated overall sequences of feeding-agitation-investigation-pick and place procedures may be basically run in parallel and optionally somewhat independently from each other. The available control logic may still collectively keep track of the overall process management so that parallel sub-processes work constructively and do not try, for instance, to erroneously place components in the same location, etc.

At 512, one or more components, preferably all components suitable for placing, are picked and mounted on the target substrate by the available pick and place equipment. Substantially simultaneous picking and placing of multiple components is possible using e.g. a multi-head pick and place equipment. Prior to or upon mounting, additional measures may be taken. For example, flux may be provided, the picked up component(s) may be heated, etc.

At 514, method execution is ended. Optional post-treatment and processing tasks may take place. The target substrate may be over-molded by or otherwise supplemented with desired material(s) such as plastics. The material(s) may have protective and/or aesthetical/decorative function, for example. Further layers or structures may be laminated to the target substrate, or the substrate may itself be attached to a host structure or host device, optionally product packaging. Lamination may be temperature, pressure and/or adhesive-based among other options.

The target substrate may be cut or otherwise processed into one or more mutually potentially identical functional ensembles each defining e.g. at least part of a device such as a tag, wireless tag, RFID (Radio Frequency Identification) tag, RFID circuit, NFC (Near-Field Communication) tag NFC circuit, antenna, antenna circuit, intelligent (electronic) label, sensor device, memory device, communications device, and/or a processing device. Adhesive may be provided to the substrate. Functional or decorative coating or graphics may be alternatively or additionally provided.

The dotted loop-back arrows reflect the potentially, and most likely, repetitive nature of the execution of various method items. The method may be executed substantially continuously, while individual components are fed, re-oriented, picked and placed either one at a time or in groups.

A computer program or computer program product embodied e.g. in a non-transitory carrier and comprising a code means adapted, when run on a computer, to execute control over the desired method items in accordance with the present invention, may be provided. Carrier media such as an optical disc, a floppy disc, or a memory card, comprising the computer program may be considered among other feasible options. The program could be alternatively delivered as a signal over a communication network and a communication channel. The communication path may be wireless or wired, or contain legs of both types.

Consequently, a skilled person may on the basis of this disclosure and general knowledge apply the provided teachings to implement the scope of the present invention as defined by the appended claims in each particular real-life use scenario with necessary modifications, deletions, and additions, if any.

The invention claimed is:

1. An apparatus for component positioning, comprising:
   a receptacle configured to receive a number of components to be placed on a target substrate,
   agitator configured to exert force impulses on the receptacle so as to cause the components to change their position including turning over inside the receptacle;
   inspection equipment configured to verify the position of the components inside the receptacle to identify one or more components that fulfill a predefined position criterion from the remaining components to be agitated more; and
   pick and place equipment configured to pick said identified one or more components from the receptacle that fulfill the predefined position criterion and place the picked components on the target substrate while leaving the remaining components in the receptacle for further agitation.

2. The apparatus of claim 1, wherein the components include integrated circuits.

3. The apparatus of claim 2, wherein the components include flip chips with bumps initially facing away from a receptacle surface such that responsive to agitation, the bumps are facing the receptacle surface thereby rendering the chips suitable for placement on the target substrate without further flipping.

4. The apparatus of claim 1, wherein the receptacle comprises a tray.

5. The apparatus of claim 1, wherein the receptacle comprises elastic material at the contact surface of the components.

6. The apparatus of claim 1, wherein the agitator comprises at least one element selected from the group consisting of vibration element, vibrating motor, ac motor, dc motor, unbalanced motor, piezoelectric element, hydraulic element, servo motor, and pneumatic element.

7. The apparatus of claim 1, wherein the inspection equipment comprises a computer vision system with at least one camera and image analyzer.

8. The apparatus of claim 1, wherein the pick and place equipment comprises or is integrated with at least one element selected from the group consisting of actuator, multi-head actuator, robotic arm, heater, flux dispenser, suction nozzle, and camera.

9. The apparatus of claim 1, further comprising feeding equipment configured to provide the receptacle with the components from a source carrier.

10. The apparatus of claim 1, further comprising a heater configured to heat the picked components.

11. The apparatus of claim 1, further comprising a flux dispenser configured to provide flux on the components or on the target substrate.

12. The apparatus of claim 1, wherein the target substrate has a supplementary layer or structure thereon.

13. The apparatus of claim 1, further comprising printing equipment configured to print a number of conductors on the target substrate.

14. The apparatus of claim 1, wherein the target substrate for which the apparatus has been configured comprises at least one element selected from the group consisting of sheet, film, plastic film, foil, web, plastics, fiber, paper, cardboard, fabric, wood, felt, metal, organic material, and biological material.

15. The apparatus of claim 1, wherein said force impulses comprise abrupt force impulses.

16. The apparatus of claim 1, further comprising feeding equipment configured to provide the receptacle with the components from a dicing membrane.

17. A method for component positioning comprising:
  locating a number of components to be finally placed on a target substrate, in a component receptacle;
  intermittently exerting force on the receptacle so as to cause the components to change their position including turning over within the receptacle;
  verifying the position of the components within the receptacle, identifying one or more components that fulfill a predefined position criterion from the remaining components to be agitated more; and
  picking said identified one or more components from the receptacle that fulfill the predefined position criterion according to the verification, and placing the components on the target substrate while leaving the remaining components in the receptacle for further agitation.

18. The method of claim 17, wherein verifying comprises image analysis of camera data.

19. The method of claim 17, comprising heating the picked components.

20. The method of claim 17, further comprising printing a number of conductors on the target substrate.

* * * * *

UNITED STATES PATENT AND TRADEMARK OFFICE
CERTIFICATE OF CORRECTION

PATENT NO. : 10,658,209 B2
APPLICATION NO. : 15/548801
DATED : May 19, 2020
INVENTOR(S) : Juha Maijala et al.

It is certified that error appears in the above-identified patent and that said Letters Patent is hereby corrected as shown below:

On the Title Page

Item (54) and in the Specification, Column 1, Line 2, In the Title:
Please delete "POSITINING" and replace with "POSITIONING."

Signed and Sealed this
Seventeenth Day of November, 2020

Andrei Iancu
*Director of the United States Patent and Trademark Office*